(12) United States Patent
Trzcinski et al.

(10) Patent No.: US 8,425,979 B2
(45) Date of Patent: Apr. 23, 2013

(54) MASKANT FREE DIFFUSION COATING PROCESS

(75) Inventors: Frank J. Trzcinski, Ellington, CT (US); Jorge Marxuach, Hartford, CT (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 13/190,030

(22) Filed: Jul. 25, 2011

(65) Prior Publication Data

US 2013/0029043 A1  Jan. 31, 2013

(51) Int. Cl.
*B05D 1/32* (2006.01)
(52) U.S. Cl.
USPC ............ 427/282; 427/252; 427/253

(58) Field of Classification Search ........... 427/252, 427/282, 253
See application file for complete search history.

(56) References Cited

U.S. PATENT DOCUMENTS

| | | | | |
|---|---|---|---|---|
| 5,071,678 | A | * 12/1991 | Grybowski et al. | 427/253 |
| 6,224,673 | B1 | * 5/2001 | Das et al. | 118/500 |
| 2001/0055650 | A1 | * 12/2001 | Pfaendtner et al. | 427/255.39 |

* cited by examiner

*Primary Examiner* — Frederick Parker
(74) *Attorney, Agent, or Firm* — Kinney & Lange, P.A.

(57) ABSTRACT

Selected areas of a component are covered with a maskant chamber during a coating process to protect the areas from the coating vapor. The covered areas are further protected by a flow of an inert gas in the maskant chamber.

20 Claims, 4 Drawing Sheets

MASKANT FREE DIFFUSION COATING PROCESS

BACKGROUND

The present invention relates to diffusion coating processes. In particular, the present invention relates to maskant free diffusion coating processes of selected areas.

Diffusion coating processes, such as diffusion aluminide coating processes, are used to apply protective coatings over metal components in a variety of industries. For example, turbine engine components are typically diffusion coated with aluminum based alloys to form aluminide coatings that protect the underlying engine components from oxidation and other environmental elements. During a diffusion coating process, it is desirable to selectively coat portions of a metal component, while allowing other portions to remain uncoated.

One technique for selectively coating a metal component involves the use of maskant film which is applied over a desired location. Another technique is to cover portions of the component with maskant powder that protects the covered portions from the coating vapor.

Following coating, the maskant needs to be removed from the component, typically by abrasive means, and the surface washed and dried. These steps add to the process time and substantially reduce the throughput of metal components.

SUMMARY

A method of applying a metal vapor coating to a selected area of a metal component while preventing the vapor from contacting other areas of the component is presented. The protected areas are encased in a masking chamber filled with flowing inert gas during vapor deposition.

DETAILED DESCRIPTION

Figure 1:
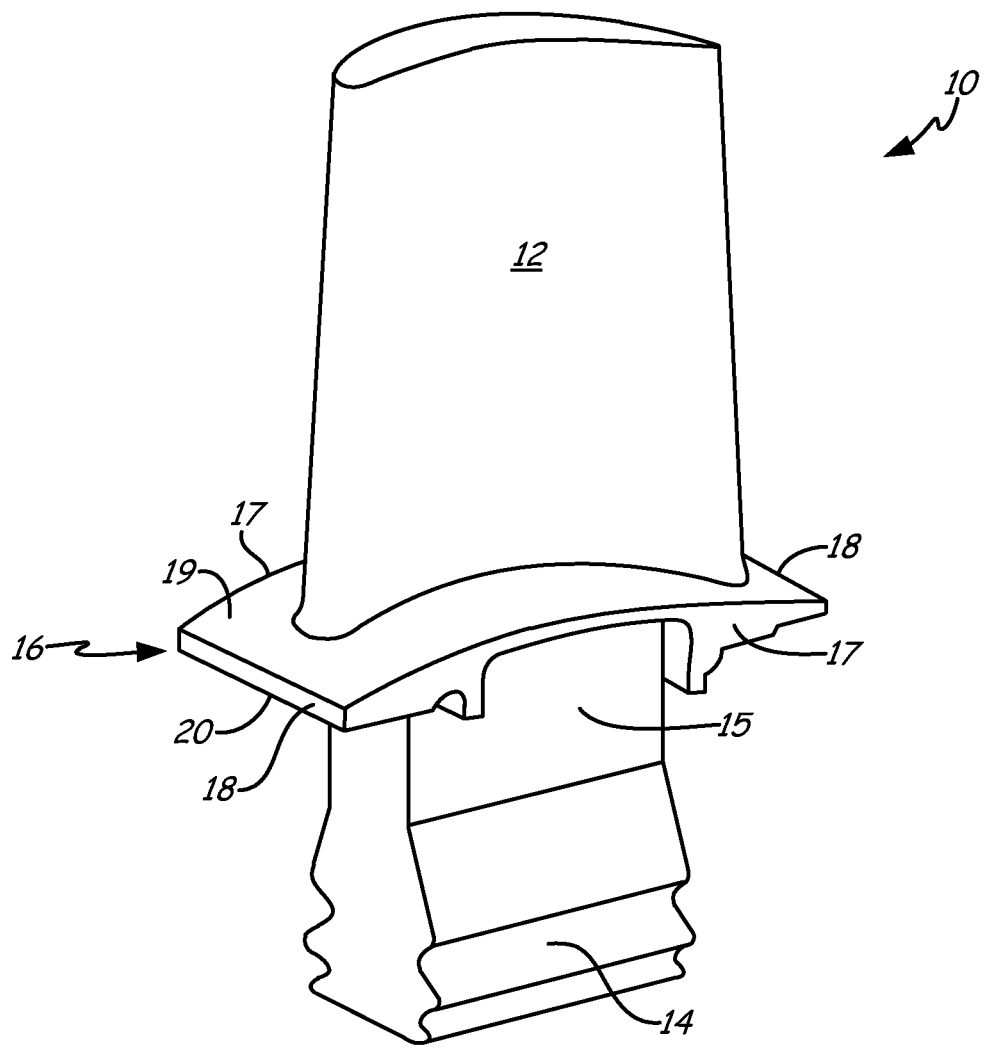
FIG. 1 is a perspective view of a gas turbine blade.

As illustrated in FIG. 1, turbine blade 10 includes airfoil 12, serrated blade root 14 (used to attach the blade to a rotatable turbine disk), and platform 16 located between airfoil 12 and serrated root 14. Platform 16 has a radially outward facing surface 19, a radially inward facing surface 20, side faces 17, and end faces 18. The region between underside 20 of blade platform 16 and root 14 is referred to as neck 15.

The invention is used in conjunction with the application of a diffusion coating to airfoil portions 12 and radially outward facing portions 19 of platform 16. Root 14, neck 15, radially inward facing underside portion 20 of platform 16, side faces 17, and end faces 18 are desirably kept free of coating.

In diffusion coating processes, aluminum based materials, chrome based materials, and silicon based materials are mixed with a halide activator and heated to form gaseous metal halide compounds which result in the deposition of the metal on the surface of the part to be coated. In an embodiment, suitable diffusion coating materials are aluminum based materials (e.g. aluminides). During heating, the aluminum based materials react with the halide activators to form gaseous metal halide compounds (e.g. aluminum halide compounds). Suitable temperatures are from about 1200° F. (about 650° C.) to about 2000° F. (about 1100° C.). The gaseous metal halide compounds decompose upon contact with the surfaces of the part, thereby depositing the diffusion coating on the surface of the part. The deposition of the diffusion coating correspondingly releases the halide activator to form additional gaseous metal halide compounds while the source of the diffusion coating material is still available.

Prior art masking techniques include gettering agents that decompose the gaseous metal halide compounds that deposit on the maskant and prevent the diffusion coating from forming on the underlying surface of the metal component. The maskant can be applied to the surface as a spray, paint, decal, and other techniques known in the art. One technique is described in commonly owned U.S. Pat. No. 7,763,326 and incorporated herein as reference. In another embodiment, portions of the part to be coated can be packed in a loose powder of the maskant.

Figure 2:
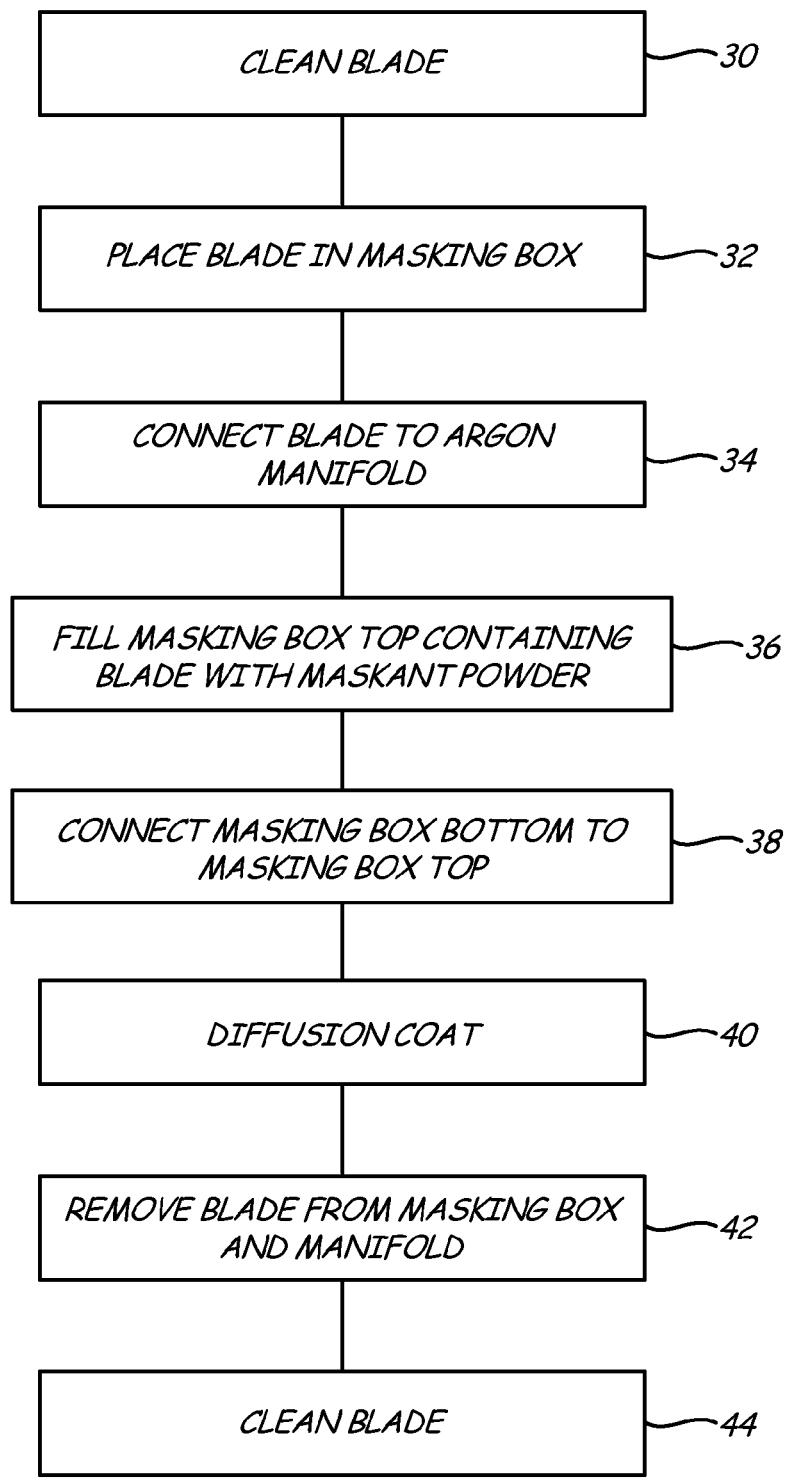
FIG. 2 is a flowchart of a prior art diffusion coating process.

An example of a prior art aluminide diffusion coating process wherein only airfoil 12 and radially outward facing portion 19 of platform 16 are diffusion coated is shown in FIG. 2. In this example, the process includes steps 30, 32, 34, 36, 38, 40, and 42.

Figure 3:
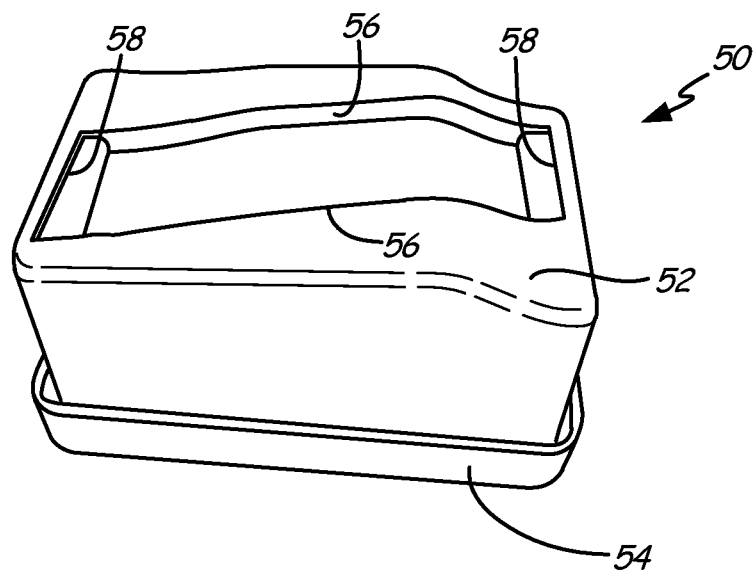
FIG. 3 is a sketch of a prior art masking box used for coating a turbine blade airfoil and radially outward facing surface of a platform.

To begin, turbine blade 10 is cleaned before coating using techniques well known in the art (Step 30). In the next step, the blade is inserted in masking box 50 shown in FIG. 3 (Step 32). Masking box 50 comprises top 52 and bottom 54. Top 52 has a cutout that closely matches the outline of platform 16 when blade 10 is inserted in top 52. Side faces 17 and end faces 18 closely match side faces 56 and end faces 58 of top 52. Masking box 50 is preferably formed of refractory ceramic or metal. Cooling passages at the bottom of root 14 (not shown) are then connected to an argon gas manifold (not shown) (Step 34).

Top 52 containing blade 10 and the argon connection is then filled with maskant powder and bottom 54 is attached (Step 36). Bottom 54 has an opening to accommodate the gas manifold. Examples of suitable commercially available gettering agents include those under the trade designation "M1 Maskant", "M7 Maskant", "M8 Maskant", and "M10 Maskant" from APV Coatings, Akron, Ohio. As noted below, maskants are gettering materials that, when placed on a substrate exposed to gaseous metal halide compounds, decompose the metal halide compounds and are coated with aluminum thereby preventing the substrate from being coated.

Blade 10 and masking box 50 are then exposed to a gaseous metal halide compound (e.g. aluminide halide compound) formed by the decomposition of a mixture of an aluminum based powder and a halide activator powder in a closed furnace container or retort at a suitable elevated temperature to coat exposed blade 12 and top of platform 19 with aluminum based materials (Step 40). Suitable temperatures for initiating the reaction range from about 1200° F. (about 650° C.) to about 2000° F. (about 1100° C.). The aluminum based compound may be an aluminum intermetallic compound. Examples of suitable aluminum intermetallic compounds for use in the diffusion coating process include chromium-aluminum (CrAl) alloys, cobalt-aluminum (CoAl) alloys, chromium-cobalt-aluminum (CrCoAl) alloys, and combinations thereof. Examples of suitable concentrations of the aluminum based compound in the powder mixture range from about 1% by weight to about 40% by weight.

The halide activator is a compound capable of reacting with the aluminum based compound during the diffusion coating process. Examples of suitable halide activators for use in the diffusion coating process include aluminum fluoride ($AlF_3$), ammonium fluoride ($NH_4F$), ammonium chloride ($NH_4Cl$), and combinations thereof. Examples of suitable concentrations of the halide activator in the powder mixture range from about 1% by weight to about 50% by weight.

The powder mixture may also include inert materials such as aluminum oxide powder. The furnace container or retort may also contain one or more gases (e.g. $H_2$ and Argon) to obtain a desired pressure and reaction concentration during the diffusion coating process.

The elevated temperature initiates a reaction between the aluminum based compounds and the halide activators to form gaseous aluminum halide compounds which decompose at surfaces 12 and 19 of blade 10 to deposit aluminum in a molten state which then interdiffuses with surfaces 12 and 19 of blade 10. The diffusion coating process continues until a desired coating thickness is reached, preferably between 25 microns and 125 microns.

Following diffusion coating, blade 10 and masking box 50 are cooled and blade 10 is removed from masking box 50 and detached from the argon manifold (Step 40). Any maskant powder remaining on the blade is then removed in a final cleaning process (Step 42). Preferably the powder is removed by an abrasive spray process followed by a water rinse.

Figure 4:
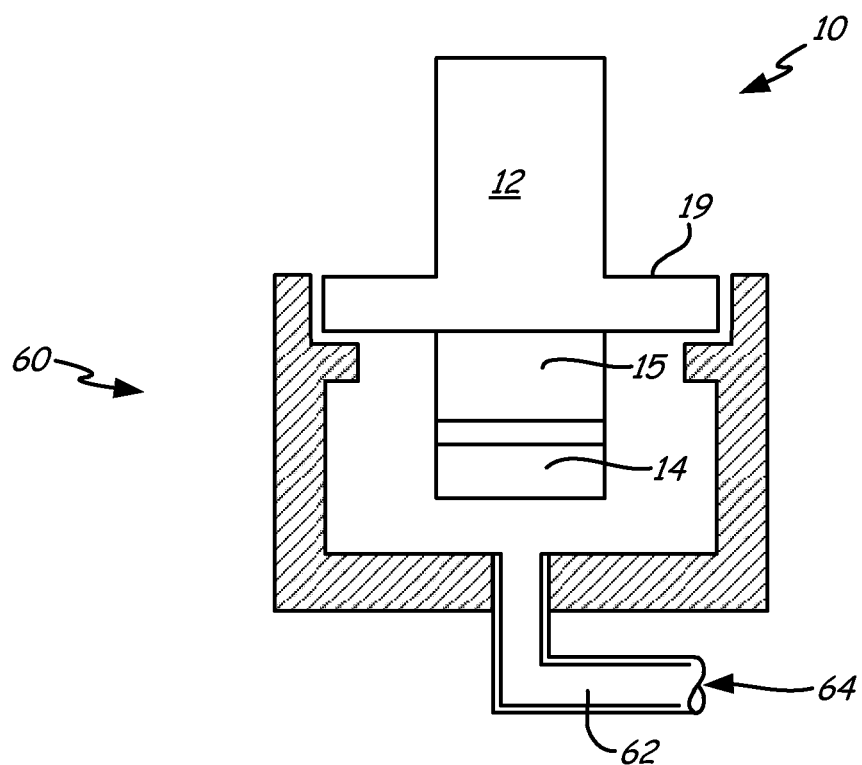
FIG. 4 is a schematic crosssection of a masking box of the invention.
Figure 5:
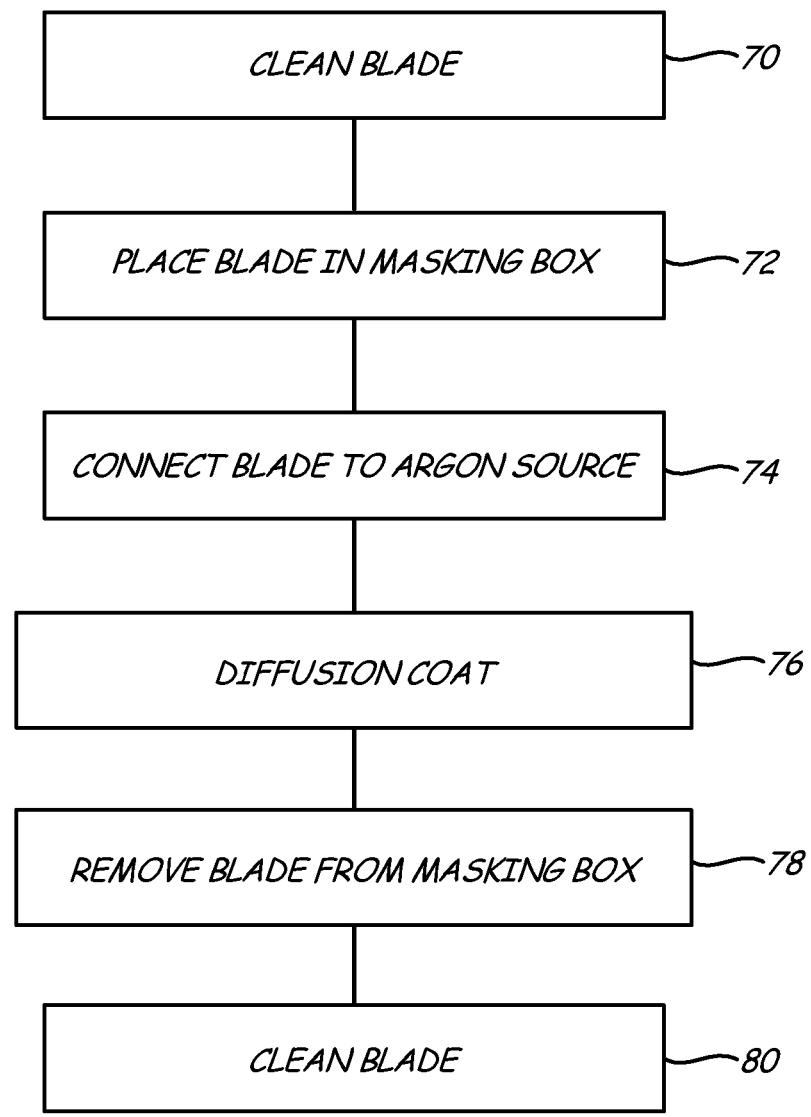
FIG. 5 is a flowchart of the diffusion coating process of the invention.

An advantage of the present invention is the elimination of the use of maskant powder in the above-mentioned diffusion coating process. Rather than connecting an argon manifold to a cooling gas port in the bottom of blade 10 in masking box 50, alternative masking box 60 was designed to allow an inert gas source to be directly connected to the bottom of masking box 60 as schematically shown in FIG. 4. The aluminide diffusion coating process of the invention is shown in FIG. 5. To begin with, turbine blade 10 is cleaned before coating using techniques well known in the art (Step 70). In the next step, the blade is inserted in masking box 60 as shown in FIG. 4 (Step 72). An inert gas source is then connected to inlet port 62 such that the inert gas flows in the direction of arrow 64 and fills masking box 60 thereby protecting the portion of blade 10 inside masking box 60 from diffusion coating. Furthermore, the inert gas flows out through cooling channels in blade 10 thereby protecting the cooling channels from the diffusion coating. Masking box 60 and turbine blade 10 are then placed in a furnace or retort for diffusion coating (Step 76). The same diffusion coating process as described earlier is used in the process of the invention. As noted, inert gas prevents entry of any gaseous metal halide compounds into masking box 60 during a diffusion coating process of surfaces 12 and 19 of blade 10. Argon, nitrogen, or hydrogen can be used as an inert gas. The inert gas, preferably argon, is maintained at a positive pressure to keep the gaseous aluminum halide coating vapors out of masking box 60 during coating. The positive pressure further assures that cooling circuitry in the blade is filled with inert gas during coating thereby preventing ingress of gaseous aluminum halide compounds in the cooling channels during coating. As a result, the use of M1 Maskant or other maskant powders has been eliminated in the diffusion coating process of the invention. In addition, the setup and cleaning procedures associated with other steps of the process have been eliminated as well thereby improving the throughput and efficiency of the coating process.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

Following diffusion coating, blade 10 is removed from masking box 60 (Step 78). Since no maskant powder is used in the invention, the abrasive cleaning step of the prior art process is eliminated and the coated blade is simply washed (Step 80).

The invention claimed is:

1. A method for coating a metal component, the method comprising:
    applying a vapor phase metal coating to a first portion of a surface of a metal component;
    protecting a second portion of a surface of a component from the metal coating by encasing the second portion of a surface of the component with a masking chamber filled with flowing inert gas at a pressure that prevents the vapor phase metal coating from entering the masking chamber.

2. The method of claim 1, wherein the metal component comprises at least one of a gas turbine blade or vane.

3. The method of claim 2, wherein the first portion of a surface comprises an airfoil portion and a radially outward facing portion of a platform.

4. The method of claim 2, wherein the second portion of a surface comprises a radially inward facing underside portion, side portions, and end portions of a platform, a root portion, and a neck portion.

5. The method of claim 1, wherein the metal component is a nickel based, cobalt based, or iron based superalloy or mixtures thereof.

6. The method of claim 1, wherein the inert gas is argon, nitrogen, or hydrogen.

7. The method of claim 1, wherein the masking chamber is a refractory ceramic or metal chamber.

8. The method of claim 1, wherein the vapor phase comprises gaseous metal halide compounds.

9. The method of claim 8, wherein the gaseous metal halide compounds comprise at least one of chromium aluminum alloys, cobalt aluminum alloys, chromium cobalt aluminum alloys and mixtures thereof.

10. The method of claim 9, wherein the metal coating is a diffusion aluminide coating.

11. A method for coating selected areas of a metal turbine component, the method comprising:
    masking selected portions of a blade with a masking chamber filled with flowing inert gas at a pressure that prevents a vapor phase metal coating from entering the masking chamber;
    exposing a masked turbine blade to the vapor phase metal coating at an elevated temperature to coat portions not protected by a masking chamber with a protective coating.

12. The method of claim 11, wherein the turbine component comprises a blade or vane.

13. The method of claim 12, wherein selected areas are a radially inward facing underside portion, side portions, and end portions of a platform, a root portion, and a neck portion.

14. The method of claim 12, wherein the metal turbine component comprises a nickel based, cobalt based, or iron based superalloy or mixtures thereof.

15. The method of claim 11, wherein the elevated temperature ranges from about 1200° F. (about 650° C.) to about 2000° F. (about 1100° C.).

16. The method of claim 11, wherein the inert gas is argon, nitrogen, or hydrogen.

17. The method of claim 11, wherein the vapor phase comprises gaseous metal halide compounds.

18. The method of claim 17, wherein the gaseous metal halide compounds comprise at least one of chromium aluminum alloys, cobalt aluminum alloys, chromium cobalt aluminum alloys, and mixtures thereof.

19. The method of claim 18, wherein the coating is a diffusion aluminide coating.

20. The method of claim 11, wherein the masking chamber is a refractory ceramic or metal chamber.

* * * * *